United States Patent
Moh et al.

(10) Patent No.: US 8,685,214 B1
(45) Date of Patent: Apr. 1, 2014

(54) MAGNETIC SHUNTING PADS FOR OPTIMIZING TARGET EROSION IN SPUTTERING PROCESSES

(75) Inventors: Chee Boon Moh, Bayan Lepas (MY); Chun Chek Chin, Bayan Lepas (MY); Kok Soon Teh, Georgetown (MY); Jium Yie Lai, Penang (MY)

(73) Assignee: WD Media, LLC, San Jose, CA (US)

( * ) Notice: Subject to any disclaimer, the term of this patent is extended or adjusted under 35 U.S.C. 154(b) by 159 days.

(21) Appl. No.: 13/250,996

(22) Filed: Sep. 30, 2011

(51) Int. Cl.
*C23C 14/54* (2006.01)

(52) U.S. Cl.
USPC .................. 204/298.16; 204/298.2; 204/192.2

(58) Field of Classification Search
USPC ............................... 204/298.2, 298.16, 192.2
See application file for complete search history.

(56) References Cited

U.S. PATENT DOCUMENTS

| | | | |
|---|---|---|---|
| 3,282,816 A | 11/1966 | Kay | |
| 4,265,729 A | 5/1981 | Morrison, Jr. | |
| 4,595,482 A | 6/1986 | Mintz | |
| 4,606,806 A | 8/1986 | Helmer | |
| 4,761,218 A | 8/1988 | Boys | |
| 4,810,346 A | 3/1989 | Wolf et al. | |
| 5,366,607 A | 11/1994 | Lal et al. | |
| 5,415,754 A | 5/1995 | Manley | |
| 5,685,959 A * | 11/1997 | Bourez et al. | 204/192.2 |
| 5,876,576 A * | 3/1999 | Fu | 204/298.2 |
| 6,277,249 B1 | 8/2001 | Gopalraja et al. | |
| 6,395,146 B2 | 5/2002 | Hieronymi et al. | |
| 6,740,212 B2 | 5/2004 | Fan et al. | |
| 6,872,284 B2 | 3/2005 | Ivanov et al. | |
| 6,916,407 B2 | 7/2005 | Voser et al. | |
| 8,137,517 B1 | 3/2012 | Bourez | |
| 2003/0178301 A1 | 9/2003 | Lynn et al. | |
| 2003/0217914 A1 | 11/2003 | Miller et al. | |
| 2005/0178661 A1 | 8/2005 | Yi et al. | |
| 2005/0217992 A1 | 10/2005 | Cord et al. | |
| 2008/0116066 A1 | 5/2008 | Miyashita | |
| 2009/0205949 A1 | 8/2009 | Zueger | |
| 2009/0314631 A1 | 12/2009 | Bernick et al. | |
| 2010/0051454 A1* | 3/2010 | Akamatsu et al. | 204/298.16 |
| 2011/0186427 A1* | 8/2011 | Bernick et al. | 204/298.16 |
| 2011/0311735 A1 | 12/2011 | Wang et al. | |

* cited by examiner

*Primary Examiner* — Keith Hendricks
*Assistant Examiner* — Timon Wanga

(57) ABSTRACT

Magnetic flux shunting pads for optimizing target erosion in sputtering processes are provided. In one embodiment, the invention relates to a sputtering system for countering uneven wear of a sputter target, the system including a sputter target having an emitting surface and a rear surface opposite to the emitting surface, a moving magnet assembly positioned proximate the rear surface and including a planar base and a magnet fixed to the planar base at a preselected point, the moving magnet assembly configured to be moved such that a position of the magnet relative to the rear surface is varied, and a magnetic shunting pad having a planar shape and positioned between the moving magnet assembly and the target, wherein the shunting pad includes uneven magnetic shunting characteristics.

26 Claims, 2 Drawing Sheets

MAGNETIC SHUNTING PADS FOR OPTIMIZING TARGET EROSION IN SPUTTERING PROCESSES

FIELD

The present invention relates to sputtering processes, and more specifically to magnetic flux shunting pads for optimizing target erosion in sputtering processes.

BACKGROUND

Sputtering processes can be used to deposit a thin film layer on a substrate or disk. Such sputtering processes can bombard a sputter target with ions and the target becomes the source of the deposition material. Due to the ion bombardment, the atoms of the target deposition material are ejected from the target and deposited on the substrate or disk. As the atoms of the target deposition material are ejected, an erosion pattern is created on the target.

The target erosion pattern is largely dictated by a magnetic field of a magnet that is positioned at the back of the target. More specifically, the magnetic field from the magnet confines the electrons which are removed from the target to a certain area of the surface target at the active sputtering area (see, for example, FIG. 2c of U.S. Pat. No. 5,876,576). As the ions bombard and erode the target, annular grooves (also called a race track or an erosion track) are created in the target. The race track or erosion depth limits the effective life of the sputter target. More specifically, when the deepest point of the erosion track reaches the bottom of the target surface, the useful life of the target is over. Typically, 20% to 35% of the sputter target material, as measured by weight, has been consumed (utilization) and the remaining material is refined into powder to form new targets. As such, the wasted target material can be as high as 65% to 80%. Accordingly, an improved sputtering system that decreases the amount of target material wasted in the sputtering process is needed.

SUMMARY

Aspects of the invention relate to magnetic flux shunting pads for optimizing target erosion in sputtering processes. In one embodiment, the invention relates to a sputtering system for countering uneven wear of a sputter target, the system including a sputter target having an emitting surface and a rear surface opposite to the emitting surface, a moving magnet assembly positioned proximate the rear surface and including a planar base and a magnet fixed to the planar base at a preselected point, the moving magnet assembly configured to be moved such that a position of the magnet relative to the rear surface is varied, and a magnetic shunting pad having a planar shape and positioned between the moving magnet assembly and the target, where the shunting pad includes uneven magnetic shunting characteristics.

DETAILED DESCRIPTION

Figure 1:
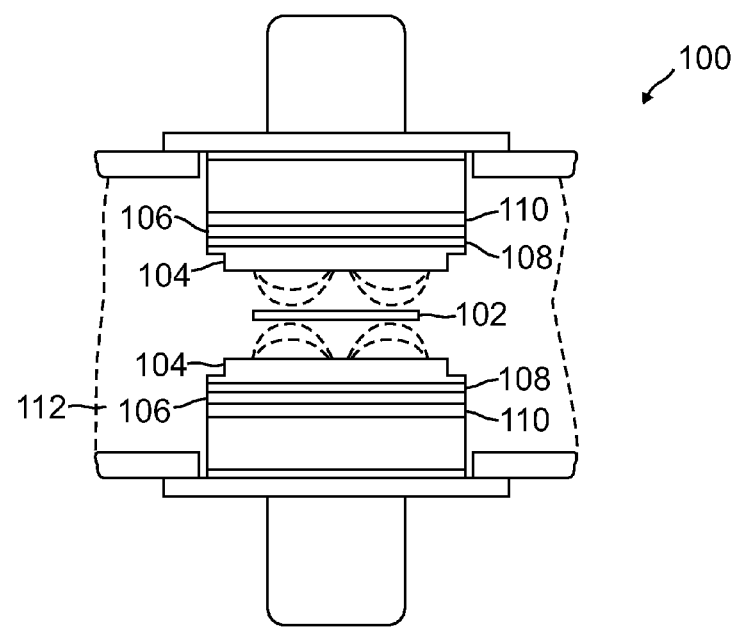
FIG. 1 illustrates a side view of a sputtering system that includes a substrate, two sputter targets, and two magnetic shunting pads for optimizing an erosion pattern of the sputter targets in accordance with one embodiment of the invention.

Referring now to the drawings, sputtering systems including a sputter target, a moving magnet assembly, and a magnetic shunting pad positioned between the sputter target and the moving magnetic are illustrated. The magnetic shunting pads have uneven magnetic shunting characteristics configured to counter uneven erosion of the sputter target. In several embodiments, the magnetic shunting pads include areas or zones having different shunting characteristics. In one embodiment, for example, the magnetic shunting pads include at least two segmented areas or zones, where the first zone has different shunting characteristics from the second zone. In some embodiments, a third zone is added to the magnetic shunting pads, where the third zone has different magnetic shunting characteristics than either of the other two areas. In many embodiments, the shunting characteristic is a pass through flux characteristic of the respective zone. In several embodiments, the magnetic shunting pads are planar disk shaped pads, and the zones take the form of one or more annular rings.

FIG. 1 illustrates a side view of a sputtering system 100 that includes a substrate 102, two sputter targets 104, and two magnetic shunting pads 106 for optimizing an erosion pattern of the sputter targets 104 in accordance with one embodiment of the invention. The sputtering system 100 further includes two backing plates 108 and two graphite sheets 110. The planar shaped substrate 102 is positioned in a central region of the sputtering system 100 and each planar surface thereof faces one of the sputter targets 104. For each planar shaped sputter target 104, a stacked structure is positioned on an outer surface thereof (e.g., target surface that is furthest from the substrate 102). The stacked structure includes the backing plate 108 that abuts the sputter target 104, a magnetic shunting pad 106 adjacent to the backing plate 108, the graphite sheet 110 adjacent to the magnetic shunting pad 106, and a rotating magnet assembly 114 (not visible in FIG. 1 but see FIG. 2) spaced apart from the graphite sheet 110. The sputtering system 100 further includes a vacuum chamber 112 where each of the sputter system components is positioned within in vacuum chamber 112.

In operation, the vacuum chamber 112 includes a plasma including a number of ions. The ions bombard the sputter targets 104 at particular concentrated areas of the sputter targets 104. The atoms of the target material are ejected from the concentrated areas of the target 104 during the ion bombardment and are deposited on the substrate 102. The concentrated areas of the sputter targets 104 are established by lines of magnetic flux emanating from the rotating magnet assembly positioned 114 behind the target 104. The lines of magnetic flux are re-directed or shunted by the two magnetic shunting pads 106 positioned between each rotating magnet assembly 114 and the respective target 104. The two magnetic shunting pads 106 can each have uneven pass through flux characteristics across the respective cross section of the pads. In such case, particular pass through flux zones in the magnetic shunting pads 106 are arranged to facilitate an even erosion pattern. In several embodiments, the arrangement of the pass through flux zones is configured to correspond to positions of magnets in magnetic assemblies (not visible in FIG. 1 but see FIG. 2) positioned behind the magnetic shunting pads 106.

Figure 2:
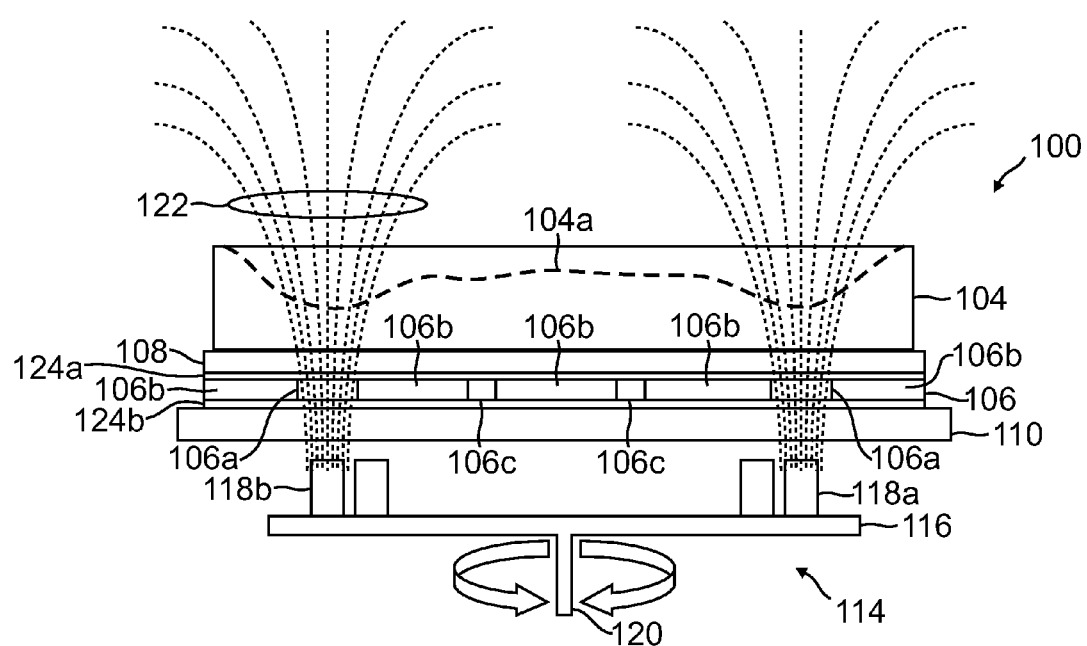
FIG. 2 illustrates a cross sectional view of a portion of the sputtering system of FIG. 1 including a sputter target, a baking plate, a magnetic shunting pad, and a rotating magnet assembly, where the magnetic shunting pad is positioned between the rotating magnet assembly and the sputter target in accordance with one embodiment of the invention.

FIG. 2 illustrates a cross sectional view of a portion of the sputtering system 100 of FIG. 1 including a sputter target 104, a baking plate 108, a magnetic shunting pad 106, and a rotating magnet assembly 114, where the magnetic shunting pad 106 is positioned between the rotating magnet assembly 114 and the sputter target 104 in accordance with one embodiment of the invention. The rotating magnet assembly 114 includes a planar base 116 and first and second magnets (118a, 118b) attached along a top surface of the planar base 116 at locations near outer edges of the planar base 116. In operation, the planar base 116 is configured to rotate about a central shaft 120 that can be driven in either a clockwise or a counterclockwise direction by a rotation assembly (not visible).

A graphite sheet 110 is positioned above, and spaced apart from, the rotating magnet assembly 114. The magnetic shunting pad 106 is positioned on the graphite sheet 110. The baking plate 108 is positioned on the magnetic shunting pad 106. The sputter target 104 is positioned on the baking plate 108. Each of the baking plate 108, the magnetic shunting pad 106, and the graphite sheet 110 can have a planar shaped body with a thickness that is about equal. The sputter target 104 can have a planar shaped body with a thickness that is about two to three times the roughly equal thickness of the baking plate 108, the magnetic shunting pad 106, and the graphite sheet 110.

The magnetic shunting pad 106 includes a first zone 106a having a first magnetic pass through flux characteristic, a second zone 106b having a second magnetic pass through flux characteristic, and a third zone 106c having a third magnetic pass through flux characteristic. The first zone 106a is positioned such that it is about aligned with one of the corresponding magnets (118a, 118b) of the rotating magnet assembly 114 positioned below the magnetic shunting pad 106. The third zone 106c is positioned closer a central point of the magnetic shunting pad 106 than the first zone 106a and is also encircled by the first zone 106a (see FIG. 3). The remaining area of the magnetic shunting pad 106 forms the second zone 106b, which is composed of a central region, an inner ring, and an outer ring (see FIG. 3).

As can be seen in FIG. 2, magnetic flux lines 122 from the magnets (118a, 118b) are guided and dispersed by the first zone 106a to have a relatively wide angle passing through the sputter target 104 as compared to prior art systems. As a result, an erosion line 104a of the sputter target 104 illustrates that the target 104 experiences significantly less erosion at the race track areas (e.g., those areas directly above the magnets and first zone 106a). As such, the usage of the sputter target material is greatly increased.

In several embodiments, the sputter target is formed of one or more materials selected from the group including Co, Cr, Ti, Ru, Fe, B, and Pt. In other embodiments, other suitable sputter target materials can be used. In the embodiment illustrated in FIG. 2, the magnetic shunting pad 106 includes a thin top layer of graphite 124a and a thin bottom layer of graphite 124b. In other embodiments, the magnetic shunting pad 106 does not include top and bottom layers of graphite.

Figure 3:
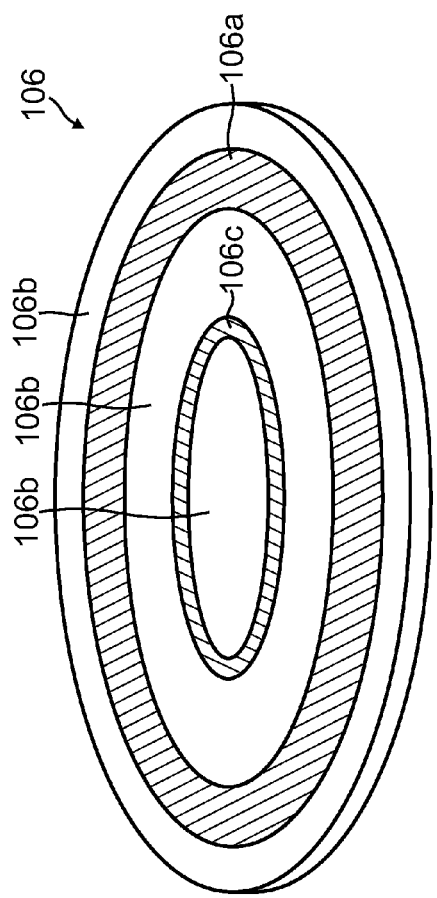
FIG. 3 illustrates a perspective view of the magnetic shunting pad for the sputtering system of FIG. 2 in accordance with one embodiment of the invention.

FIG. 3 illustrates a perspective view of the magnetic shunting pad 106 for the sputtering system of FIG. 2 in accordance with one embodiment of the invention. As discussed above, the magnetic shunting pad 106 has a planar disk shaped body with the three zones (106a, 106b, 106c) having different magnetic pass through flux characteristics. The first zone 106a forms a first annular ring around the disk shaped pad 106. The second zone 106b includes a centrally located circular section and two annular ring sections positioned on either side of the first annular ring (e.g., the first zone 106a). The third zone 106c forms a third annular ring around the disk shaped pad 106 which is positioned within the first annular ring (e.g., the first zone 106a) and around the centrally located circular section of the second zone 106b.

In several embodiments, the magnetic shunting pad 106 has a diameter of about 180 millimeters (mm) and a thickness of about 4 to 5 mm. In some embodiments, the first annular ring of the first zone 106a has a width of about 20 to 30 mm, and the third annular ring of the third zone 106c has a width of about 20 to 50 mm. In one embodiment, the width of the third zone is increased such that the circular portion of the second zone 106b in the center of the shunting pad 106 is effectively eliminated. In other embodiments, the zones can have other suitable dimensions. In several embodiments, the widths of the zones are determined based on the strength and shape of the corresponding magnet of the rotating magnet assembly proximate the respective zone and the original erosion pattern for the sputtering system prior to use of the novel magnetic shunting pad 106.

In several embodiments, the first zone 106a is formed of a first alloy providing a relatively low pass through flux characteristic. For example, in some embodiments, the first zone 106a and first alloy provide for less than about 10 percent flux passage. In one such embodiment, the first zone 106a provides for about 1 percent flux passage. In several embodiments, the second zone 106b is formed of a second alloy providing a relatively high pass through flux characteristic. In some embodiments, for example, the second zone 106b and second alloy provide for about 95 to about 100 percent flux passage. In one such embodiment, the second zone 106b provides for about 100 percent flux passage. In several embodiments, the third zone 106c is formed of a third alloy providing a relatively average or medium pass through flux characteristic. In some embodiments, for example, the third zone 106c and third alloy provide for about 45 to about 65 percent flux passage. In one such embodiment, the second zone 106b provides for about 55 percent flux passage. In other embodiments, each of the zones (106a, 106b, 106c) can provide for other suitable flux passage percentages.

In several embodiments, the first alloy of the first zone 106a includes one or more materials selected from the group including Ni, W, Al, Fe, Co, Zr, B, and Cu. In one embodiment, the first alloy of the first zone 106a includes NiWAlFe. In several embodiments, the second alloy of the second zone 106b includes one or more materials selected from the group including Ni and W. In one embodiment, the first alloy of the first zone 106a includes NiW. In several embodiments, the third alloy of the third zone 106c includes one or more materials selected from the group including Ni, W, Al, Fe, Co, and Ta. In one embodiment, the third alloy of the third zone 106a includes NiWAlFe. In other embodiments, any of the three alloys can be formed of other suitable materials.

In the embodiment illustrated in FIG. 3, the magnetic shunting pad 106 includes three zones having preselected shapes (e.g., annular rings). In other embodiments, magnetic shunting pad 106 includes only two zones, or alternatively, more than three zones. In other embodiments, the preselected shapes for the zones of different magnetic shunting can have other suitable shapes. For example, in other embodiments, the annular rings can be arranged in other ways and have different thicknesses than the illustrated thicknesses. In the embodiment illustrated in FIG. 3, the magnetic shunting pad 106 has a planar disk shape. In other embodiments, the magnetic shunting pad can have another suitable shape (e.g., thin block shape). In several embodiments, the zones are arranged such that the magnetic shunting pad effectively provides a gradient of pass through flux characteristics across the planar surface of the shunting pad. In other embodiments, other suitable arrangements of zones for providing uneven pass through flux characteristics to offset conventional or undesirable erosion patterns can be used.

In several embodiments, the magnetic shunting pad can be installed in a model 3010, 3040, or 3050 sputter system made by Canon ANELVA Corporation of Tokyo, Japan. In other embodiments, the magnetic shunting pad can be used in other suitable sputter systems.

Figure 4:
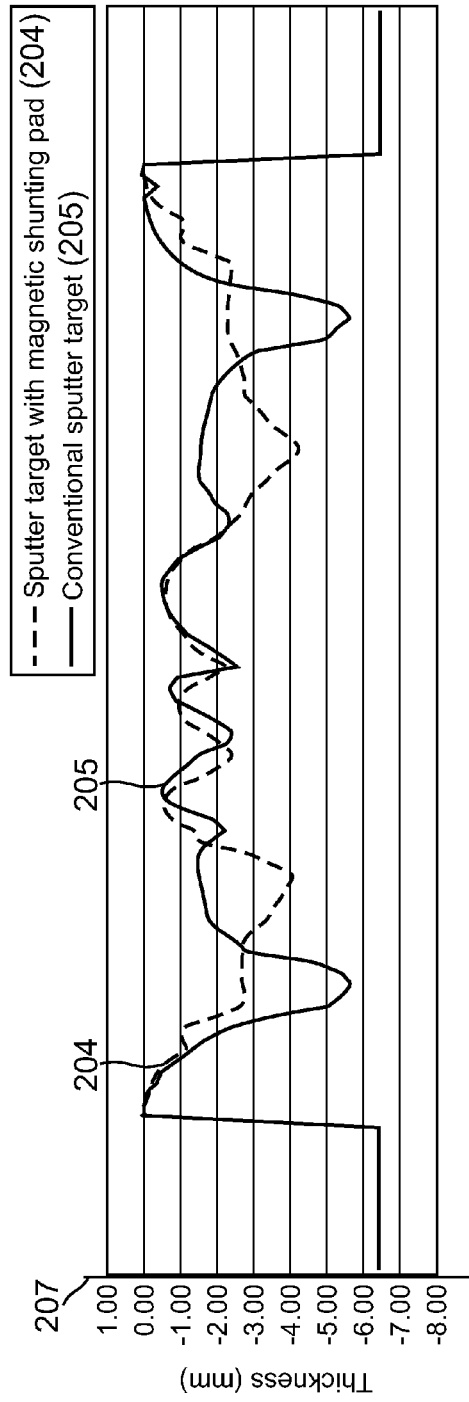
FIG. 4 illustrates a cross sectional profile view of a sputter target erosion pattern for a sputtering system using a magnetic shunting pad in accordance with one embodiment of the invention and a sputter target erosion pattern for a conventional sputtering system.

FIG. 4 illustrates a cross sectional profile view of a sputter target erosion pattern 204 for a sputtering system using a magnetic shunting pad in accordance with one embodiment of the invention and a sputter target erosion pattern 205 for a conventional sputtering system. The view further includes a vertical axis legend 207 with horizontal depth lines for quantifying the amount of erosion found along each of the sputter targets (204, 205). As can be seen in FIG. 4, the conventional sputter target 205 used in a sputter system without a magnetic shunting pad provides for material usage of about 20 to 35 percent. However, the sputter target 204 used in the improved sputter system with the novel magnetic shunting pad improves material usage by more than about 50 percent. In several embodiments, the magnetic shunting pad can also improve the sputtering rate, which can improve the outer diameter and inner diameter thicknesses by about 15 to about 20 percent.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A sputtering system for countering uneven wear of a sputter target, the system comprising:
    a sputter target having an emitting surface and a rear surface opposite to the emitting surface;
    a moving magnet assembly positioned proximate the rear surface and comprising a planar base and a magnet fixed to the planar base at a preselected point, the moving magnet assembly configured to be moved such that a position of the magnet relative to the rear surface is varied;
    a magnetic shunting pad having a planar shape and positioned between the moving magnet assembly and the target, wherein the shunting pad comprises two zones comprising different materials and correspondingly different magnetic pass through flux characteristics; and
    a backing plate positioned between the magnetic shunting pad and the target.

2. The sputtering system of claim 1, wherein the magnetic shunting pad comprises:
    a first zone having a first magnetic pass through flux characteristic; and
    a second zone having a second magnetic pass through flux characteristic greater than the first magnetic pass through flux characteristic.

3. The sputtering system of claim 2, wherein the magnetic shunting pad comprises a third zone having a third magnetic pass through flux characteristic greater than the first magnetic pass through flux characteristic and less than the second magnetic pass through flux characteristic.

4. The sputtering system of claim 3, wherein the first pass through flux characteristic is less than about 10 percent flux passage, wherein the third pass through flux characteristic is about 45 to about 65 percent flux passage, and wherein the second pass through flux characteristic is about 95 to about 100 percent flux passage.

5. The sputtering system of claim 3:
    wherein the first zone comprises one or more materials selected from the group consisting of Ni, W, Al, Fe, Co, Zr, B, and Cu;
    wherein the third zone comprises one or more materials selected from the group consisting of Ni, W, Al, Fe, Co, and Ta; and
    wherein the second zone comprises one or more materials selected from the group consisting of Ni and W.

6. The sputtering system of claim 2, wherein the first pass through flux characteristic is less than about 10 percent passage, wherein the second pass through flux characteristic is about 95 to about 100 percent passage.

7. The sputtering system of claim 2, wherein the first pass through flux characteristic is about 1 percent passage, wherein the second pass through flux characteristic is about 100 percent passage.

8. The sputtering system of claim 1, wherein the target comprises a predetermined erosion pattern, and wherein the magnetic shunting pad comprises a magnetic shunting pattern corresponding to the predetermined erosion pattern and is configured to cause a erosion pattern on the target more uniform than the predetermined erosion pattern.

9. The sputtering system of claim 8, wherein the magnetic shunting pad comprises:
    a first zone having a first magnetic pass through flux characteristic; and
    a second zone having a second magnetic pass through flux characteristic greater than the first magnetic pass through flux characteristic,
    wherein the predetermined erosion pattern of the target comprises a first target area having higher erosion than other areas of the target, and
    wherein the first zone is aligned with the first target area.

10. The sputtering system of claim 9, wherein the magnet is aligned with the first zone.

11. The sputtering system of claim 1, wherein the magnetic shunting pad comprises a disk shape.

12. The sputtering system of claim 11, wherein the magnetic shunting pad comprises:
    a first zone having a first magnetic pass through flux characteristic; and
    a second zone having a second magnetic pass through flux characteristic greater than the first magnetic pass through flux characteristic,
    wherein the first zone comprises an annular ring along the disk shape,
    wherein the second zone comprises two annular rings along the disk shape, wherein each of the two annular rings of the second zone is adjacent to the annular ring of the first zone.

13. The sputtering system of claim 11, wherein the magnetic shunting pad comprises:
    a first zone having a first magnetic pass through flux characteristic;
    a second zone having a second magnetic pass through flux characteristic greater than the first magnetic pass through flux characteristic; and a third zone having a third magnetic pass through flux characteristic greater than the first magnetic pass through flux characteristic and less than the second magnetic pass through flux characteristic, wherein the first zone comprises an annular ring along the disk shape, wherein the third zone comprises an annular ring along the disk shape having a diameter less than a diameter of the annular ring the first zone, wherein the second zone comprises two annular rings along the disk shape, wherein each of the two annular rings is adjacent to the annular ring of the first zone.

14. The sputtering system of claim 11, wherein the second zone further comprises a circular area positioned within the annular ring of the third zone.

15. The sputtering system of claim 1, wherein the target, the planar base of the moving magnet assembly, and the magnetic shunting pad each comprise a disk shape.

16. The sputtering system of claim 1, wherein the moving magnet assembly is configured to rotate about a central point of the planar base.

17. The sputtering system of claim 16, wherein the magnet is fixed to the planar base at a preselected distance from the central point.

18. The sputtering system of claim 16, wherein the magnet is configured to be rotated in a plane parallel to the rear surface of the target.

19. The sputtering system of claim 1, wherein the magnetic shunting pad is coupled to the rear surface of the target.

20. The sputtering system of claim 1, wherein the magnetic shunting pad abuts the backing plate.

21. The sputtering system of claim 1, wherein the magnetic shunting pad abuts the backing plate which is coupled to the rear surface of the target.

22. The sputtering system of claim 1, wherein the planar shaped shunting pad comprises a magnetic shunting gradient taken along a surface of the planar shaped shunting pad which provides uneven magnetic shunting characteristics.

23. The sputtering system of claim 1, further comprising a first intervening layer positioned between the backing plate and the magnetic shunting pad.

24. The sputtering system of claim 23, further comprising:
a graphite sheet; and
a second intervening layer sandwiched between the magnetic shunting pad and the graphite sheet.

25. The sputtering system of claim 24, wherein the first intervening layer and the second intervening layer each comprise graphite.

26. The sputtering system of claim 23, wherein the first intervening layer comprises graphite.

* * * * *